(12) United States Patent
Jin

(10) Patent No.: US 10,873,043 B2
(45) Date of Patent: Dec. 22, 2020

(54) FLEXIBLE DISPLAY APPARATUS

(71) Applicant: LG DISPLAY CO., LTD., Seoul (KR)

(72) Inventor: Jaehyun Jin, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/554,319

(22) Filed: Aug. 28, 2019

(65) Prior Publication Data

US 2020/0136066 A1   Apr. 30, 2020

(30) Foreign Application Priority Data

Oct. 31, 2018 (KR) .......................... 10-2018-0132601

(51) Int. Cl.
*H01L 35/24* (2006.01)
*H01L 51/00* (2006.01)
(Continued)

(52) U.S. Cl.
CPC ...... *H01L 51/0097* (2013.01); *H01L 27/3276* (2013.01); *H01L 51/5253* (2013.01);
(Continued)

(58) Field of Classification Search
CPC ............. H01L 27/3276; H01L 51/0097; H01L 2251/5338; H01L 27/1225; H01L 29/7869; H01L 27/124; H01L 51/5253; H01L 2227/323; H01L 27/3244; H01L 51/5237; H01L 51/5246; H01L 2224/13101; H01L 23/4985; H01L 27/323; H01L 27/3262; H01L 2924/181; H01L 29/78693; H01L 29/78696; H01L 51/56; H01L 23/49838; H01L 23/5226; H01L 23/544; H01L 24/09; H01L 27/1218; H01L 27/1248; H01L 27/1266; H01L 27/1288; H05K 2201/10128; H05K 1/189; H05K 1/147; H05K 5/0017; H05K 1/028; H05K 1/09; H05K 1/118; H05K 3/4644; H05K 5/0217; H05K 5/03; H05K 1/00; H05K 1/0216; H05K 1/0268; H05K 1/0274; H05K 1/0278; H05K 1/03; H05K 1/0366; H05K 1/0393; H05K 1/111; H05K 1/115; H05K 1/144;
(Continued)

(56) References Cited

U.S. PATENT DOCUMENTS

| | | | |
|---|---|---|---|
| 10,020,462 B1 * | 7/2018 | Ai | H01L 51/524 |
| 2015/0382446 A1 * | 12/2015 | Kwon | H01L 27/3276 174/251 |
| 2016/0172428 A1 * | 6/2016 | Song | H01L 27/3276 257/99 |

* cited by examiner

*Primary Examiner* — Robert G Bachner
(74) *Attorney, Agent, or Firm* — Birch, Stewart, Kolasch & Birch LLP

(57) ABSTRACT

A flexible display apparatus can have a flexible substrate including: an active area including a plurality of driving TFTs and a plurality of organic emission elements, and an inactive area including a first inactive area adjacent to the active area, a second inactive area for a circuit board, and a bending area between the first inactive area and the second inactive area; a component disposed on at least a part of the first inactive area; a plurality of wiring lines extending from the plurality of driving TFTs to the first inactive area, the bending area and the second inactive area; and a support layer disposed across the active area, the first inactive area, the bending area, and the second inactive area, in which a portion the support layer includes at least one cut portion overlapping with the bending area of the flexible substrate.

17 Claims, 10 Drawing Sheets

(51) Int. Cl.
  *H01L 27/32* (2006.01)
  *H01L 51/52* (2006.01)
  *G06F 3/044* (2006.01)
  *G06F 3/041* (2006.01)

(52) U.S. Cl.
  CPC ............ *G06F 3/044* (2013.01); *G06F 3/0412* (2013.01); *G06F 2203/04102* (2013.01); *G06F 2203/04105* (2013.01); *H01L 2251/5338* (2013.01)

(58) Field of Classification Search
  CPC .......... H05K 1/148; H05K 1/18; H05K 1/181; H05K 1/186; H05K 2201/0145; H05K 2201/0154; H05K 2201/032; H05K 2201/0347; H05K 2201/041; H05K 2201/055; H05K 2201/056; H05K 2201/09036; H05K 2201/09063; H05K 2201/10053; H05K 2201/10106; H05K 2201/10136; H05K 2201/10143; H05K 2201/10151; H05K 2201/10545; H05K 2201/10734; H05K 2203/0292; H05K 2203/1316; H05K 2203/1322; H05K 2203/1327; H05K 2203/1377; H05K 3/0011; H05K 3/06; H05K 3/12; H05K 3/28; H05K 3/284; H05K 3/285; H05K 3/303; H05K 3/328; H05K 3/341; H05K 3/361; H05K 3/368; H05K 3/38; H05K 3/4007; H05K 3/42; H05K 3/429; H05K 3/46; H05K 3/4691; H05K 3/4697; H05K 5/0004; H05K 5/0086; H05K 5/02; H05K 5/0234; H05K 9/0083; G06F 3/0412; G06F 3/044; G06F 3/0416; G06F 1/1652; G06F 2203/04103; G06F 2203/04105; G06F 3/041; G06F 3/0443; G06F 1/16; G06F 1/1626; G06F 2203/04102; G06F 2203/04104; G06F 2203/04106; G06F 3/014; G06F 3/03545; G06F 3/04164; G06F 3/045; G06F 1/1616; G06F 1/163; G06F 1/1635; G06F 1/1681; G06F 1/32; G06F 1/324; G06F 21/32; G06F 2203/0384; G06F 2203/04112; G06F 2203/04808; G06F 3/01; G06F 3/016; G06F 3/017; G06F 3/0202; G06F 3/03547; G06F 3/038; G06F 3/0414; G06F 3/0418; G06F 3/0446; G06F 3/0448; G06F 3/046; G06F 3/047; G06F 3/04883; G06F 3/14; G06F 3/167

See application file for complete search history.

FLEXIBLE DISPLAY APPARATUS

CROSS-REFERENCE TO RELATED APPLICATIONS

This application claims the benefit of priority under 35 U.S.C. § 119(a) to Korean Patent Application No. 10-2018-0132601 filed in the Republic of Korea on Oct. 31, 2018, the entirety of which is incorporated herein by reference.

BACKGROUND

Field

The present disclosure relates to a display apparatus, and more particularly, to a flexible display apparatus with a display panel that can be bent.

Description of the Related Art

As the information age advances, the field of display for visually displaying electrical information signals has developed rapidly. In accordance with the rapid development, various display apparatuses having excellent performance, such as thin thickness, light weight, and low power consumption properties have been developed.

Specific examples of the above-mentioned display apparatuses may include a liquid crystal display apparatus (LCD), a field emission display apparatus (FED), an organic light emitting display apparatus (OLED), a quantum dot display apparatus, and the like.

Each of the display apparatuses may be equipped with a display panel and numerous components for providing various functions. For example, one or more display driving circuits for controlling the display panel may be included in a display assembly. Examples of the driving circuits may include gate drivers, emission (source) drivers, power (VDD) routing, electrostatic discharge (ESD) circuits, multiplex (MUX) circuits, data signal lines, cathode contacts, and other functional elements. Further, numerous peripheral circuits for providing various kinds of extra functions, such as touch sensing or fingerprint identification function, may be included in the display assembly. Some of the components may be disposed on the display panel itself or on a peripheral area next to an active area. The peripheral area will be often called "inactive area or non-active area" in the present disclosure.

In recent years, size and weight have been of notable importance in designing display apparatuses. Also, a high ratio of the active area size to that of the inactive area, which is sometimes called "screen to bezel ratio," is one of the more important features in display design. However, placing some of the components in the display assembly may require a large inactive area, which may add up to a significant portion of the display panel. The large inactive area tends to make the display panel bulky, which may make it difficult to incorporate the display panel into a housing of the display apparatus. The large inactive area may necessitate a large masking (e.g., bezel border, covering material) to cover a significant portion of the display panel, leading to an aesthetically unappealing display apparatus.

Some of the components can be placed on a separate flexible printed circuit board (FPCB) and positioned on the backplane of the display panel. Even with such a configuration, however, components for driving the panel, such as interfaces for connecting the lines between the FPCB and the active area or driver ICs, are still disposed in the inactive area. Thus, the amount of decrease in bezel size is limited.

SUMMARY

The inventors of the present disclosure recognized that various high-level techniques relating to the position and width of lines, a signal transfer method, etc. are desired to implement a narrow bezel with a reduced proportion of an inactive area. Accordingly, the inventors of the present disclosure studied various designs by using flexibility of display apparatuses employing a flexible substrate. As a result, the inventors of the present disclosure invented a new structure for a minimized inactive area where images are not displayed, and a method for manufacturing the new structure.

For example, preferably, the proportion of the inactive area can be decreased and the proportion of the active area can be increased by bending a part of the display panel to manufacture a smaller and lighter display apparatus. This method also allows a part of the inactive area to be positioned behind the active area of the display panel. Therefore, the inactive area to be hidden under the masking or device housing can be reduced or eliminated. The bending of the flexible substrate can minimize the size of the inactive area to be hidden from view and thus make it possible to implement a narrow-bezel or bezel-free display apparatus. Also, it is possible to provide flexible display apparatuses with innovative designs.

However, there are new challenges that need to be solved in providing such flexible display panels.

Various components, as well as display pixels, can be placed right on the flexible substrate. In this situation, the flexible substrate can have a small thickness for flexibility. Thus, the components on the thin flexible substrate may be fragile to various mechanical and environmental stresses generated during the manufacture and/or in the use of the display apparatus. Particularly, mechanical stresses from bending of the flexible display panel can negatively affect the reliability of the product and even result in failures of the complete components. For example, line-related components such as power (VDD) routing and data signal lines extended from the inactive area and formed in the bending area may have a change in radius curvature (R) caused by bending of the flexible substrate. For example, the change in radius curvature may occur during a process of bending the flexible substrate, a process of attaching an FPCB or emission (source) driver to the flexible substrate after the bending process, or a process of bonding the manufactured display panel to the modules of the display apparatus after the bonding process. The change in radius curvature may cause the concentration of tensile stress and compressive stress on the corresponding bent portion. Thus, the components formed in the bending area may not endure the tensile stress and compressive stress and cracks may occur in some or all of the components, which may cause a functional failure of the product. Hereinafter, an area of the substrate to be bent is defined as a bending area or bending part.

To protect the components against various stresses which may be generated as described above, a member configured to support the flexible substrate in the bending area can be further provided under the bending area. The flexible substrate can be bent at a certain radius curvature.

Touch performance of a display apparatus, as well as display resolution, has been considered as one of the important performance factors. In response to various demands for improvement in touch performance, technologies therefore have been developed. Accordingly, not only can a display panel sense a touch on a specific site by a finger or an object, but the display panel can more easily sense a fine touch by a specific device such as a pen capable of inducing electromagnetism. Otherwise, the display panel can sense a touch pressure and provide additional functions to various applications executed in the display apparatus. The addition of functions inevitably requires addition of separate touch-related devices under the display panel.

When a pen touch function using electromagnetic induction is used, a fine touch can be sensed so that a detailed drawing can be drawn on the display apparatus. However, in order to use this function, a separate device formed as an electrode layer capable of recognizing an electromagnetic induction pen is inserted under the display panel.

A force touch function of sensing a touch pressure on the display apparatus may be used. In order to use this function, a separate device including a space for maintaining a certain distance and sensors for sensing the degree of contraction of the space when the display apparatus is touched is inserted under the display panel.

The addition of these devices does not fit the trend of slim and light display apparatuses, and further addition of a member for supporting the bending area is not preferred. However, if the display apparatus is manufactured without the member for supporting the bending area, the bending area can be easily cut or damaged by external impacts during the manufacture or during the use of the display apparatus.

In this respect, during a bending process, it is desirable to maintain a constant radius curvature of the bending area without a separate member under the flexible substrate in order to implement the above-described narrow-bezel or bezel-free display apparatus.

According to an aspect of the present disclosure, a display apparatus includes a flexible substrate including an active area and an inactive area including a first area adjacent to the active area, a second area where a circuit board is placed, and a bending area between the first area and the second area. The display apparatus also includes a plurality of driving TFTs and a plurality of organic emission elements placed in the active area. The display apparatus further includes a component placed on at least a part of the first area and lines extended from the plurality of driving TFTs to the first area, the bending area, and the second area. The display apparatus also includes a support layer placed in the active area, the first area, the bending area, and the second area. The support layer placed in the bending area includes at least one cut portion.

According to another aspect of the present disclosure, a display apparatus includes a substrate divided into an active area and an inactive area. The display apparatus also includes a light emitting display element placed in the active area and an encapsulation layer covering the light emitting display element and placed on at least a part of the inactive area. The display apparatus further includes a polarizing layer placed on the encapsulation layer and a cover window placed on the polarizing layer. The display apparatus also includes a first component forming part provided in a part of the inactive area and a notch line and a bending part placed on one side of the first component forming part and bending a part of the inactive area. The display apparatus further includes a second component forming part placed on the outermost periphery of the inactive area and including a bottom surface placed to face a bottom surface of the active area by the bending part. The display apparatus also includes a support layer placed from the bottom surface of the active area to the bottom surface of the second component forming part. At least a part of the support layer placed in the bending part is removed.

Details of other embodiments will be included in the detailed description and the accompanying drawings.

In a display apparatus according to embodiments of the present disclosure, a flexible substrate is applied to partially or entirely fold an inactive area, which is a non-display area, of a display panel into a form having a predetermined radius curvature. The partially or entirely folded inactive area is placed behind an active area which is a display area. Thus, the display panel can have a slim or narrow bezel overall.

Therefore, a user can use a display apparatus whose entire front surface serves as a screen for images in an aesthetic sense. Further, the display apparatus uses compact modules in the narrow bezel and thus provides the user with improved grip and light weight in a functional sense. Furthermore, the display apparatus according to embodiments of the present disclosure includes a separate coating layer on a component forming part. The coating layer is provided to protect components such as various lines formed on a bending area of the substrate when the inactive area is partially or entirely folded into a form having a predetermined radius curvature with a constant distance between the substrates. Thus, it is possible to reduce external impacts which may be applied before or after the manufacture of the display panel and tensile stress and compressive stress which may be applied to the components on the flexible substrate during a bending process. Therefore, it is possible to suppress short circuit or damage to the components and thus possible to secure more stable production yield. Even when the user inadvertently applies impacts to the display apparatus, failure of the bending area can be suppressed. Further, in the display apparatus according to embodiments of the present disclosure, notches are formed on at least two corners of the display panel to maintain a constant distance between the substrates by folding partially or entirely the inactive area into a form having a predetermined radius curvature. The notches can optimize repulsive force of the flexible substrate which may be generated by bending a relatively small area and thus minimize stress which may be generated on the flexible substrate. Therefore, it is possible to manufacture a more stable display panel.

Furthermore, in the display apparatus according to embodiments of the present disclosure, a support layer is provided on the bottom surfaces of the active area and the inactive area of the flexible substrate. Thus, it is possible to protect light emitting elements, driving circuits, and other components disposed on the display panel against torsion and deformation which may occur to the flexible substrate during the manufacture of the display panel.

Moreover, in the display apparatus according to embodiments of the present disclosure, the support layer is consecutively formed under the bending area to disperse and endure various stresses applied to the flexible substrate during a bending process. Therefore, it is possible to manufacture a more stable display panel.

Further, in the display apparatus according to embodiments of the present disclosure, a part of the support layer placed under the bending area of the flexible substrate is cut out and/or removed using a laser or other tools. Thus, it is possible to reduce compressive stress which may be applied to the support layer when a part of the inactive area is folded. Also, the support layer can perform its original function of maintaining and supporting a constant distance between the substrates by keeping the bending form after a bending process is completed. Therefore, it is possible to manufacture a stable display panel.

Furthermore, in the display apparatus according to embodiments of the present disclosure, a part of the support layer placed under the bending area of the flexible substrate is cut out and/or removed. Thus, it is possible to minimize compressive stress applied to the support layer when the bending area in the inactive area is folded. Therefore, bending can be performed more easily and stably. After the bending is completed, trimming lines of the support layer are in contact with each other. Therefore, it is possible to manufacture a display panel with a minimized distance between the substrates.

Moreover, in the display apparatus according to embodiments of the present disclosure, a part of the support layer placed under the bending area of the flexible substrate is removed in the form of, but not limited to, a set of cylindrical holes, a set of pyramid holes, or a rectangular trench. Therefore, it is possible to manufacture a display panel while considering the shape of a laser, the convenience in processing, and the easiness in bending during a removing process.

The effects of the present disclosure are not limited to the effects mentioned above, and other effects not mentioned can be clearly understood by those skilled in the art from the following description.

It should be noted that the contents of the present disclosure described in the problems, the solutions to the problems, and the effects described above do not specify all features of the claims. Accordingly, the scope of the claims is not limited to what is described in the description of the present disclosure.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION OF THE EMBODIMENTS

Figure 1:
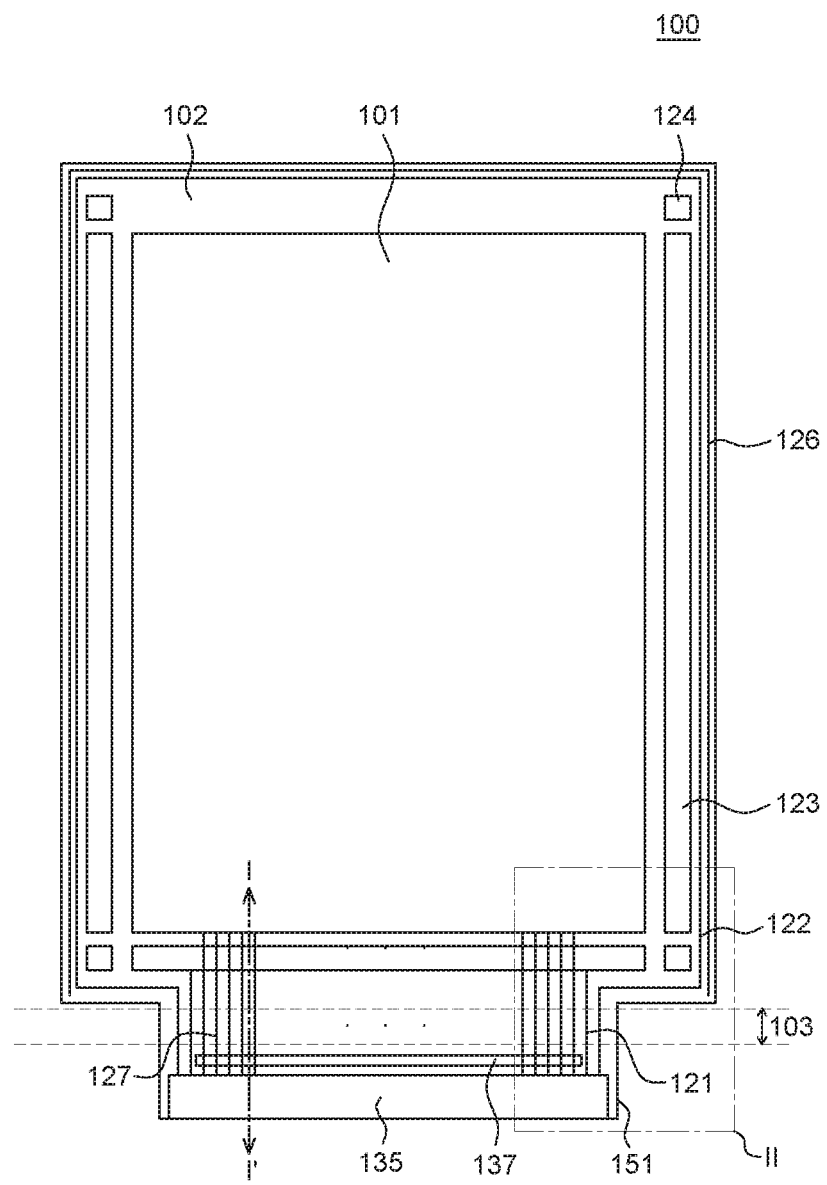
FIG. 1 is a plan view of a display panel according to an example embodiment of the present disclosure.

Advantages and characteristics of the present disclosure and a method of achieving the advantages and characteristics will be clear by referring to the embodiments described below in detail together with the accompanying drawings. However, the present disclosure is not limited to the embodiments disclosed herein but will be implemented in various forms. The embodiments are provided by way of example only so that a person of ordinary skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the various embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "comprising" used herein are generally intended to allow other components to be added unless the terms are used with the term "only." Any references to singular may include plural unless expressly stated otherwise.

Components are interpreted to include an ordinary error range (e.g., a tolerance range) even if not expressly stated.

When the position relation between two elements is described using the terms such as "on," "above," "below," and "next," one or more elements may be positioned between the two parts unless the terms are used with the term "immediately" or "directly."

Although the terms "first," "second," and the like are used for describing various components, these components are not confined by these terms. These terms are merely used for distinguishing one component from the other components. Therefore, a first component to be mentioned below may be a second component in a technical concept of the present disclosure.

Each of the features of the various embodiments of the present disclosure can be combined or combined with each other partly or entirely. The features of the various embodiments can be technically interlocked and driven as well. The features of the various embodiments can be practiced independently or in conjunction with each other independently of each other.

Hereinafter, various embodiments of the present disclosure will be described in detail with reference to accompanying drawings.

FIG. 1 is a block diagram illustrating an electroluminescent display apparatus according to an embodiment of the present disclosure.

In the present disclosure, examples of a "display apparatus" can include a narrow-sense display apparatus such as a liquid crystal module (LCM), an OLED module, or a quantum dot module equipped with a display panel and a driving unit for driving the display panel. Further, examples of the "display apparatus" can include a set apparatus (or a set device) or a set electronic device such as a notebook computer, a TV, a computer monitor, an automotive display or another type of equipment display for vehicles, or a mobile electronic device such as a smartphone or an electronic pad, which are complete products (or final products) including an LCM, an OLED module, or a QD module.

Therefore, in the present disclosure, examples of the display apparatus can include a narrow-sense display apparatus itself, such as an LCM, an OLED module, or a QD module, and a set apparatus which is a final consumer apparatus or an application product including the LCM, the OLED module, or the QD module.

In some situations, the LCM, the OLED module, or the QD module including a display panel and a driving unit can be referred to as "display apparatus" in a narrow-sense. The electronic apparatus as a final product including the LCM, the OLED module, or the QD module can be differently referred to as "set apparatus". For example, the display apparatus in a narrow-sense can include an LDC, OLED, or QD display panel and a source printed circuit board (PCB) which is a controller for driving the display panel. The set device can further include a set PCB which is a set controller electrically connected to the source PCB to overall control the set apparatus.

The display panel used for the present embodiment can be any type of display panel, e.g., a liquid crystal display panel, an organic light emitting diode (OLED) display panel, a quantum dot display panel, an electroluminescent display panel, etc. The display panel of the present embodiment is not limited to a specific display panel including a flexible substrate for OLED display panel and a back plate support structure and capable of bending a bezel. Further, the display panel used for the embodiment of the present disclosure is not limited in its shape or size.

More specifically, if the display panel is the OLED display panel, the display panel can include a plurality of gate lines, a plurality of data lines, and a plurality of pixels respectively provided in intersections of the gate lines and the data lines. Also, the display panel can include an array including a thin film transistor (TFT) configured to selectively apply a voltage to each of the pixels, an OLED layer on the array. Further, the display panel can include an encapsulation substrate or an encapsulation layer disposed on the array to cover the OLED layer. The encapsulation layer can protect the TFT and the OLED layer against external impacts and suppress the permeation of moisture or oxygen into the OLED layer. Furthermore, a layer provided on the array can include an inorganic light emitting layer, such as a nano-sized material layer, a quantum dot, or the like.

In the present disclosure, FIG. 1 illustrates an example of an organic light emitting diode (OLED) display panel 100 which can be integrated into display apparatuses.

Figure 2:
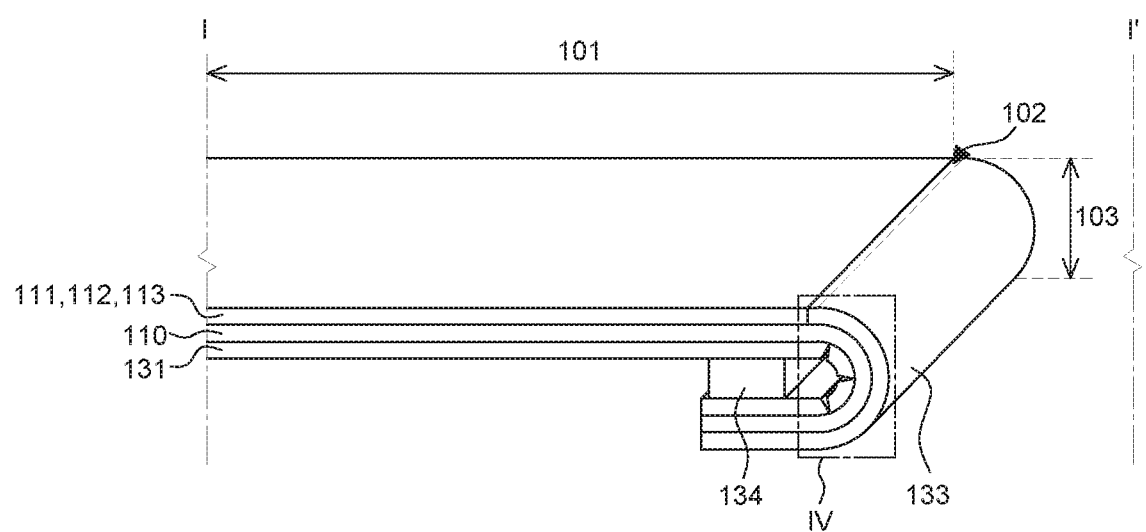
FIG. 2 is a cross-sectional view as taken along a cutting line I-I' of FIG. 1 according to an embodiment of the present disclosure.
Figure 3:
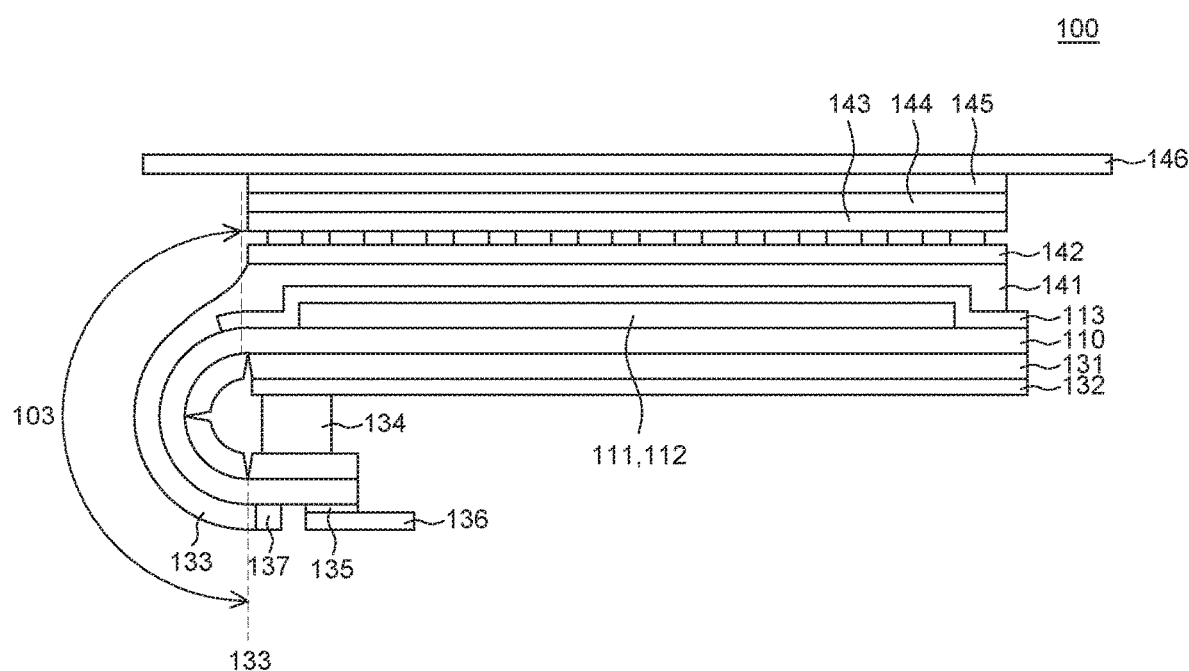
FIG. 3 is a cross-sectional view of a bending structure of the display panel according to an embodiment of the present disclosure.
Figure 4:
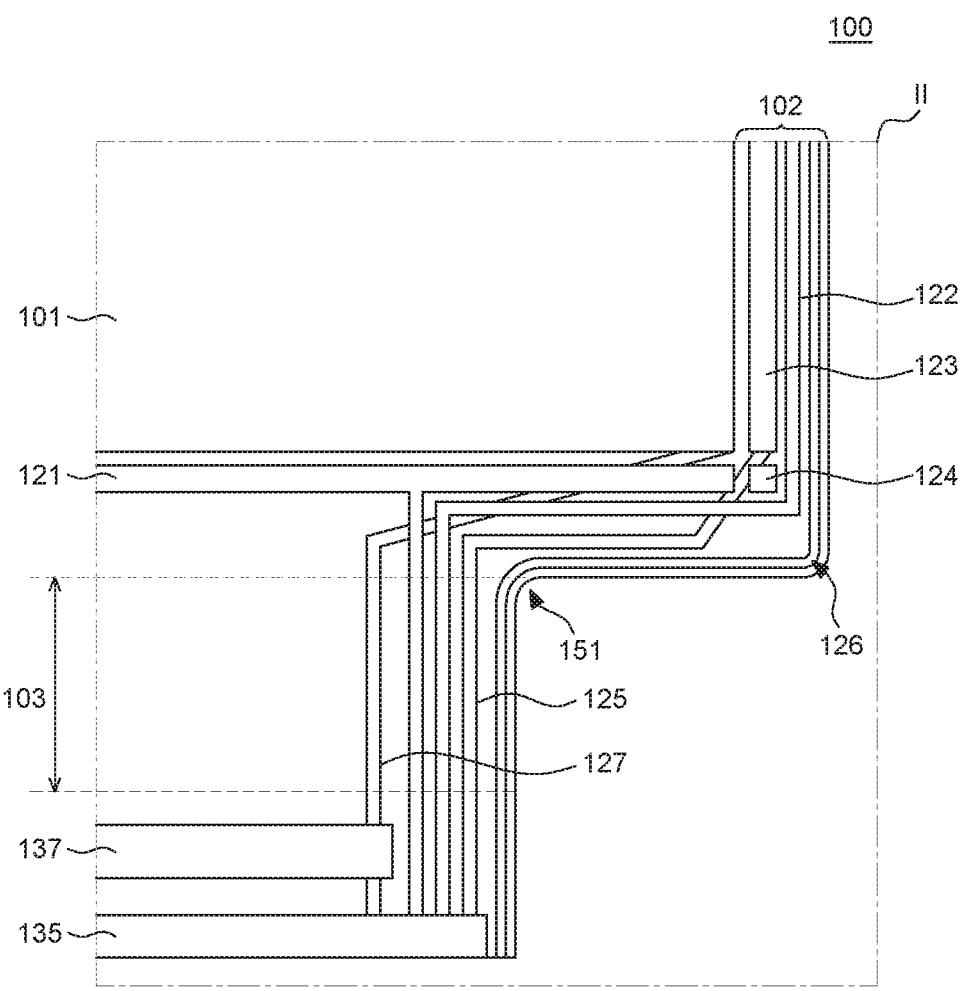
FIG. 4 is an enlarged plan view of a portion II indicated by an alternate long and short dash line in FIG. 1 according to an embodiment of the present disclosure.
Figure 5A:
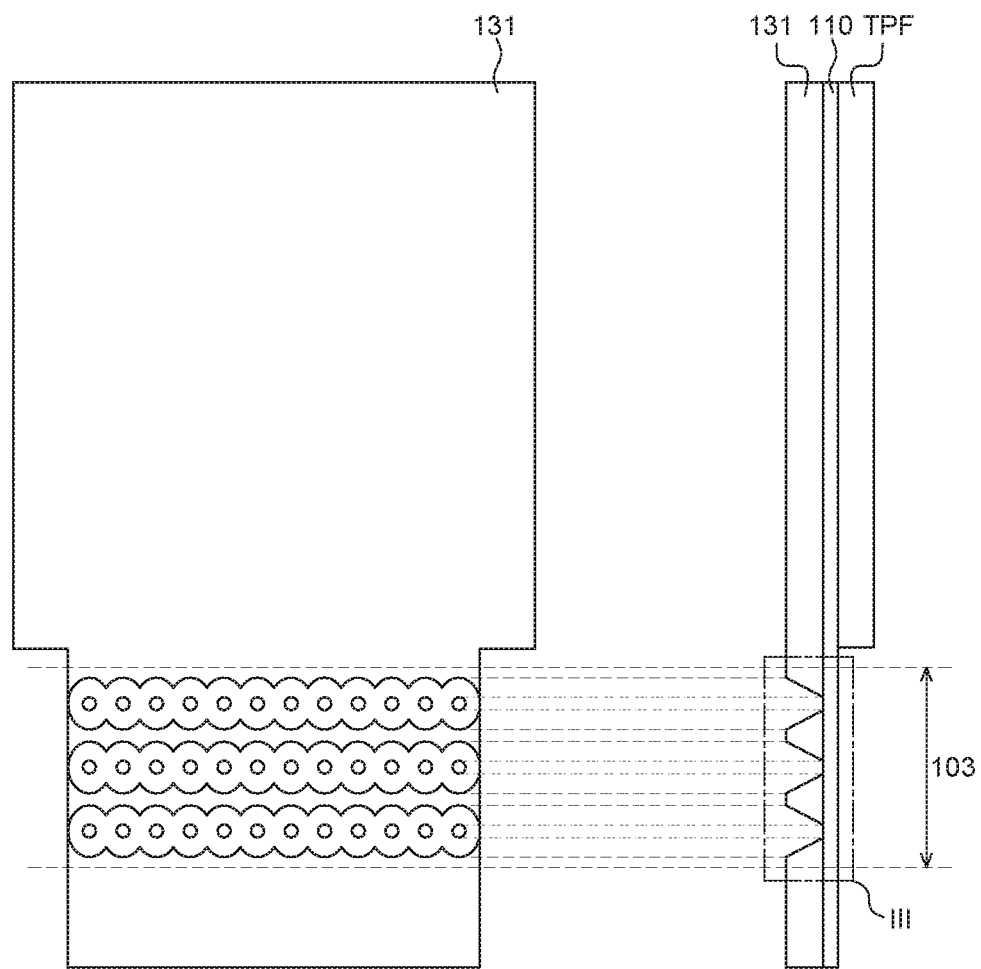
FIG. 5A shows a plan view and a side view of a cut structure of a support layer according to an embodiment of the present disclosure.
Figure 5B:
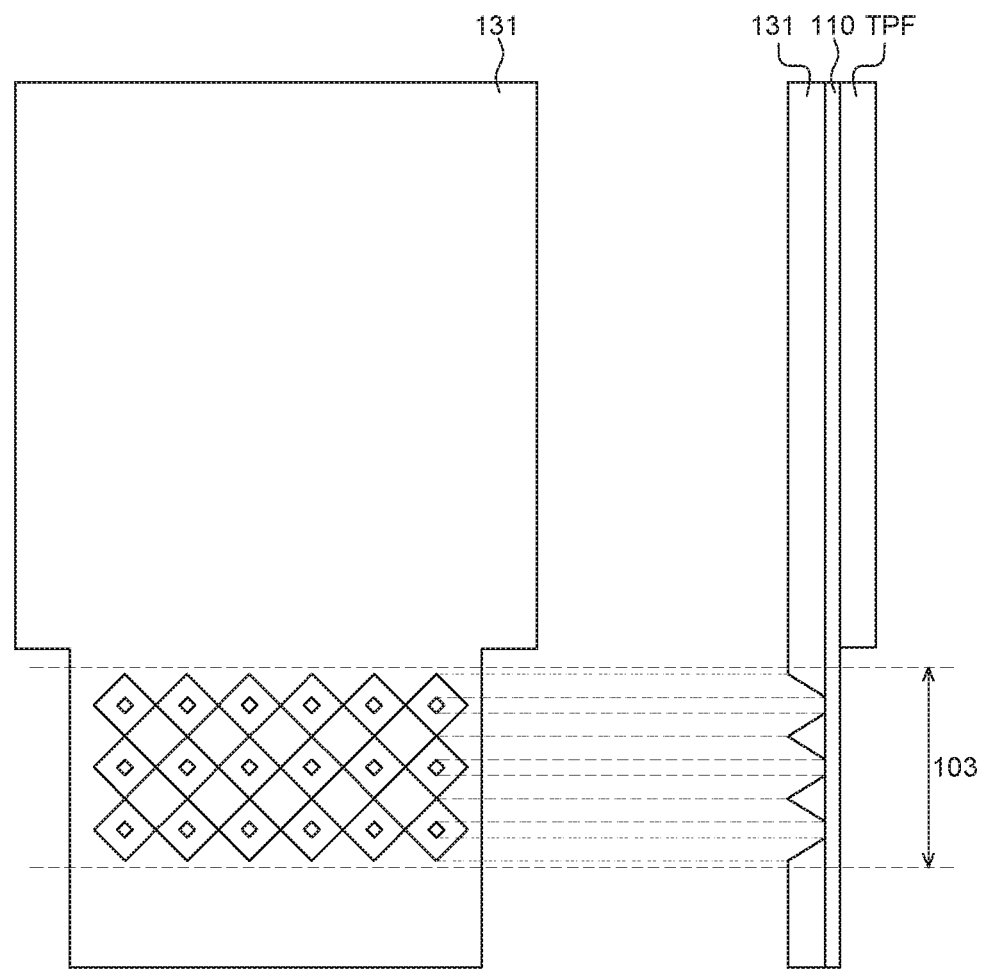
FIG. 5B shows a plan view and a side view of a cut structure of the support layer according to another embodiment of the present disclosure.
Figure 6A:
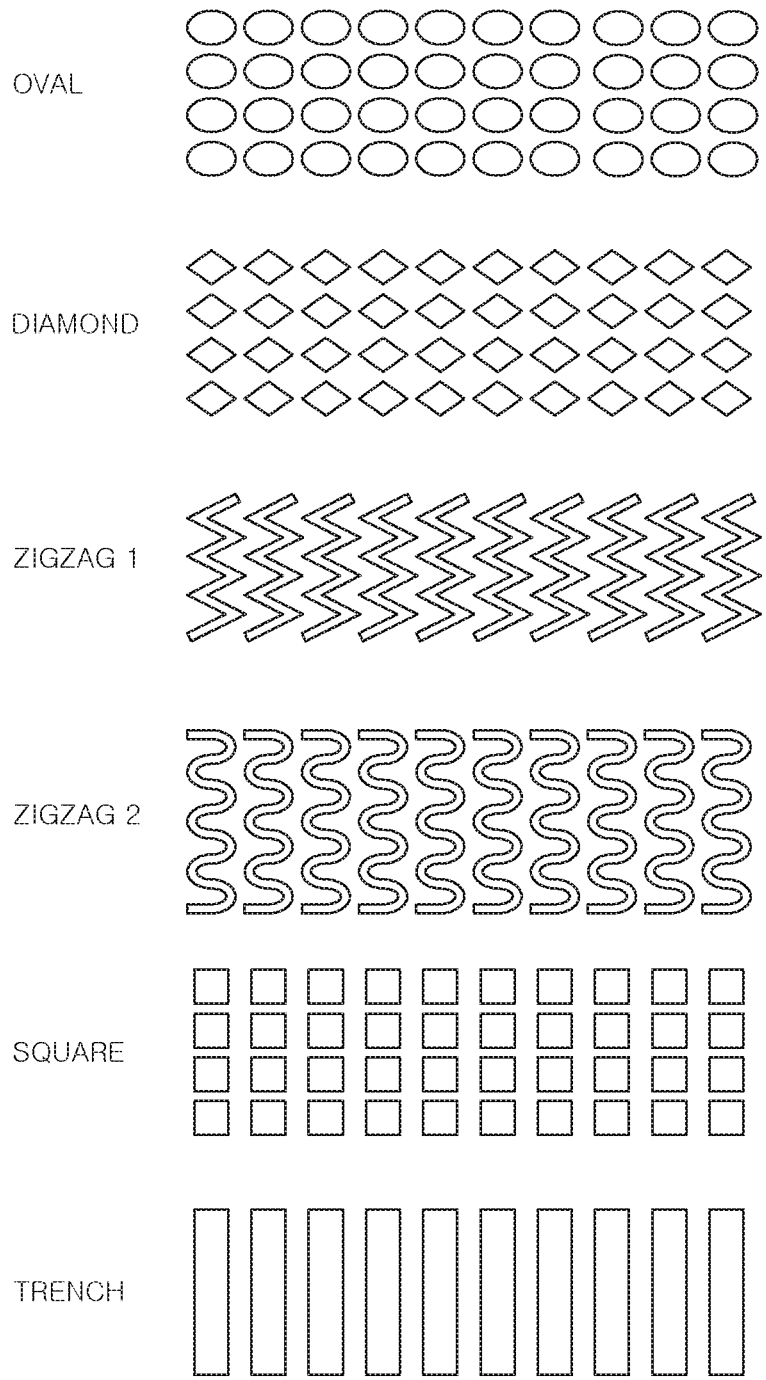
FIG. 6A shows various cut shapes of a support layer according to embodiments of the present disclosure.
Figure 6B:
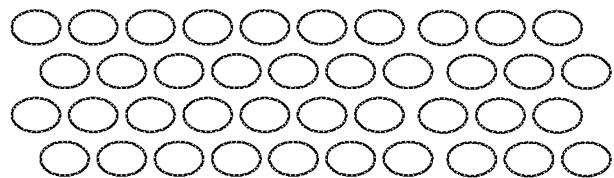
FIG. 6B shows various cut shapes of the support layer according to embodiments of the present disclosure.
Figure 6B:
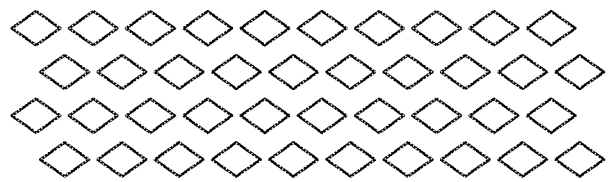
Figure 6B:
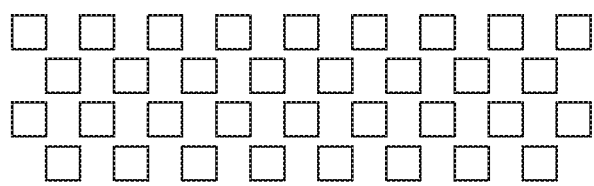
Figure 7A:
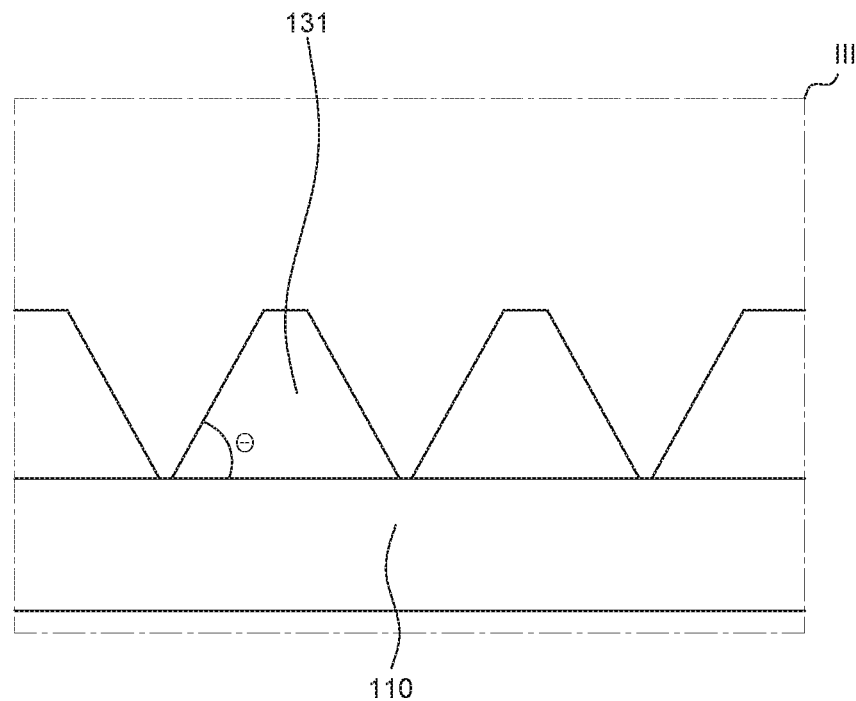
FIG. 7A is an enlarged cross-sectional view of a portion III indicated by an alternate long and short dash line in FIG. 5A according to an embodiment of the present disclosure.
Figure 7B:
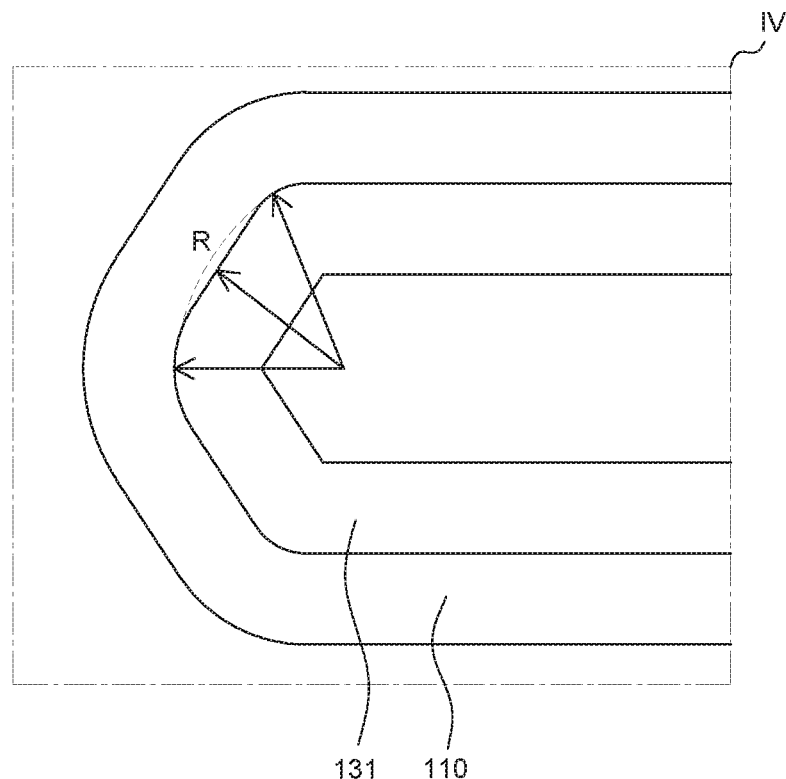
FIG. 7B is an enlarged cross-sectional view of a portion IV indicated by an alternate long and short dash line in FIG. 2 according to an embodiment of the present disclosure.
Figure 8:
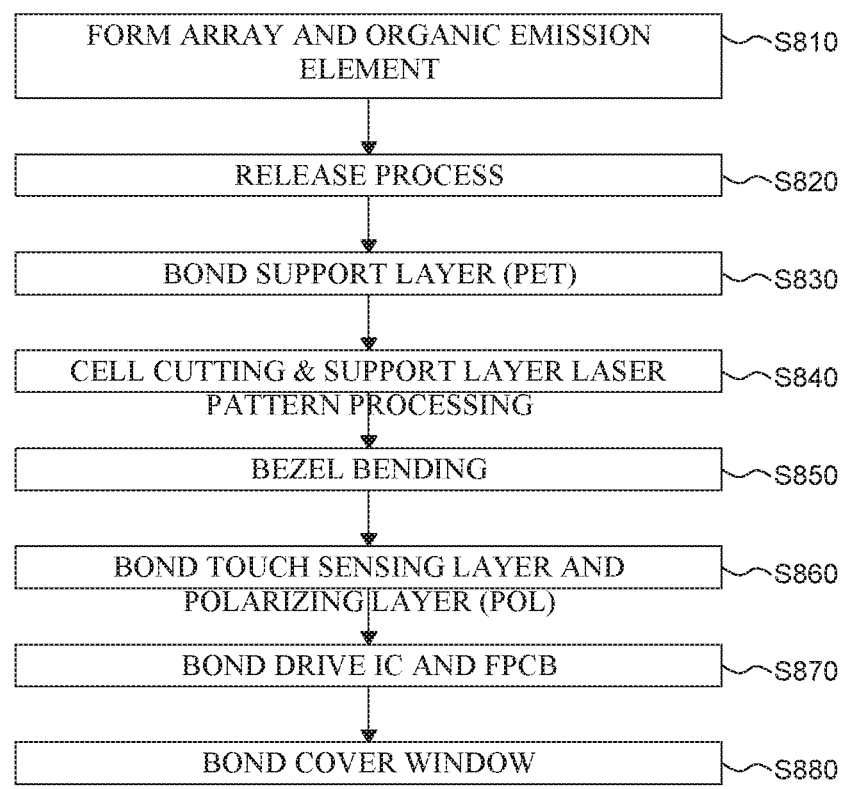
FIG. 8 is a flowchart showing the sequence of processes according to an embodiment of the present disclosure.

FIG. 1 is a plan view of a display panel according to an embodiment of the present disclosure. FIG. 2 is a cross-sectional view as taken along a cutting line I-I' of FIG. 1 and illustrates a flexible substrate of FIG. 1 in a bent and fully folded state. FIG. 3 is a cross-sectional view illustrating that a cover window is completely bonded on an upper part of the display panel in a bent state according to an embodiment of the present disclosure. FIG. 4 is an enlarged plan view of a portion II indicated by an alternate long and short dash line in FIG. 1 and illustrates the layout of components around a notch. FIG. 5A shows a plan view and a side view of a cut structure of a support layer according to an embodiment of the present disclosure. FIG. 5B shows a plan view and a side view of another cut structure, which is different from that of FIG. 5A, of the support layer according to an embodiment of the present disclosure. FIG. 6A shows various cut shapes of a support layer according to an embodiment of the present disclosure. FIG. 6B shows overlapped patterns among various cut shapes of the support layer as shown in FIG. 6A according to an embodiment of the present disclosure. FIG. 7A is an enlarged cross-sectional view of a portion III indicated by an alternate long and short dash line in FIG. 5A according to an embodiment of the present disclosure. FIG. 7A is also a picture of a sample used in a test for the present disclosure. FIG. 7B is an enlarged cross-sectional view of a portion IV indicated by an alternate long and short dash line in FIG. 2 according to an embodiment of the present disclosure. FIG. 7B is also a picture of a sample used in a test for the present disclosure. FIG. 8 schematically shows the sequence of processes according to an embodiment of the present disclosure.

Referring to FIG. 1, the display panel 100 includes at least one active area 101 in which emission elements 112 and arrays 111 are disposed.

The display panel 100 can further include an inactive area 102 disposed on the periphery of the active area 101. The upper, lower, left and right sides of the active area 101 can be referred to as the inactive area 102. The active area 101 can have a rectangular shape. Display apparatuses of various shapes, such as a circular shape, an oval shape, or a polygonal shape, can be applied to smart watches or vehicles. Therefore, the layout of the inactive area 102 surrounding the active area 101 is not limited to the display panel 100 as shown in FIG. 1. The display panel 100 shown in FIG. 1 includes the inactive area 102 on the left and right sides of the active area 101. In the inactive area 102, various components for driving the emission elements 112 and the arrays 111 disposed in the active area 101 can be positioned to provide a function for stable light emission. Herein, the inactive area 102 on the left and right sides of the active area 101 can also be referred to as "first component forming part." In the inactive area 102 on the left and right sides of the active area 101, circuits such as a gate-in-panel circuit (GIP) 123 and an electrostatic discharge circuit (ESD) 124 are disposed. Further, in the inactive area 102 on the left and right sides of the active area 101, an area for contact between a cathode which is a part of the emission elements and a low-potential voltage (VSS) line 122 which is a reference voltage point for the emission elements is disposed. Also, in the inactive area 102 on the left and right sides of the active area 101, a plurality of dam structures can be disposed to suppress an overflow of a particle cover layer of an encapsulation layer 113 for protecting the emission elements 112 against external moisture or foreign materials to the outside of the display panel 100 during a coating process. Further, in the inactive area 102 on the left and right sides of the active area 101, a crack stopper structure 126 can be disposed to suppress the spread of cracks, which may occur during a scribing process for dividing the separate display panel 100 from a mother substrate, to the inside of the display panel 100.

In embodiments of the present disclosure, the crack stopper structure 126 can function to suppress damage to the GIP 123 or ESD 124 disposed in the inactive area 102 or the VSS 122 caused by impacts generated on trimming lines of the substrate 110 during a scribing process. Further, the crack stopper structure 126 can prevent the occurrence of dark spots and pixel shrinkage by preventing or protecting from impacts, since otherwise, such impacts could provide a moisture permeation path to the emission elements 112 or the arrays 111 disposed in the active area (e.g., since the crack stopper structure 126 can protect from such impacts, then a moisture permeation path can also be avoided or prevented). In other words, the crack stopper structure 126 can provide a dual function, such as impact protection and moisture permeation prevention.

The crack stopper structure 126 can be formed of an inorganic layer or an organic layer, or a multilayer of inorganic and organic layers. FIG. 1 illustrates the crack stopper structure 126 as disposed on both long sides and one short side of the display panel 100. However, the present disclosure is not limited thereto. For example, the crack stopper structure 126 can also be disposed in a bending area 103 and an area where a notch 151 is formed. That is, the crack stopper structure 126 can be disposed on the entire periphery of the substrate 110.

In the outer side of the crack stopper structure 126, e.g., an area adjacent to the trimming lines of the substrate 110, insulating layers GI (buffer layer, and the like) deposited in the entire active area can be partially or entirely etched. Thus, a small part of the insulating layers can remain on the substrate 110 or an upper surface of the substrate 110 can be fully exposed. Therefore, cutting impacts cannot be transmitted to the insulating layers.

Referring to FIG. 1, a pad 135 configured to receive a data driving signal from an external power supply or transmit and receive a touch signal can be provided in a lower area of the display panel 100. Further, an FPCB 136 electrically connected to the pad 135 and a high-potential voltage (VDD) line 121 extended from the FPCB 136, the low-potential voltage (VSS) line 122 and/or a data voltage line 127 can be provided in the lower area of the display panel 100.

In the present disclosure, the data voltage line 127 can be disposed as connected to a data driver IC 137 that generates emission signals for the emission elements 112.

An area where the pad 135 and the data driver IC 137 are disposed can also be referred to as "second component forming part." A part of the VDD line 121 and a part of the VSS line 122 can be disposed in the second component forming part.

Referring to FIG. 1, the display panel 100 can include the notch 151 formed by cutting both bottom corners of the display panel 100 for bending of a bending area 103 as indicated by an alternate long and short dash line.

For example, during a scribing process for dividing a separate panel from the mother substrate, the both bottom corners of the display panel 100 included in the inactive area 102 can be cut toward the inside of the inactive area 102. As a result, the notch 151 is formed so that trimming lines can be adjacent to the VDD line 121 or the VSS line 122.

In the present disclosure, the notch 151 starts from one end of the flexible substrate 110 and bending is performed around the notch and ended around the data driver IC 137. Thus, the area of the flexible substrate where the data driver IC 137 and the FPCB pad 135 are disposed can be in contact with the back side of the active area of the flexible substrate.

A member connected to the pad 135 formed on a top surface of the display panel 100 is not limited to the FPCB 136, and various members can be connected to the pad 135. The pad 135 can be positioned on the top surface or the back side of the display panel 100.

FIG. 1 illustrates, but is not limited to, the data driver IC 137 as disposed on the top surface of the display panel. The data driver IC 137 can be positioned on the back side of the display panel 100 without being limited to the top surface of the display panel 100.

FIG. 2 illustrates a cross-section of the inactive area 102 of the display panel 100 of FIG. 1 in a bent state and is a cross-sectional view as taken along a cutting line I-I' of FIG. 1. FIG. 2 schematically illustrates the active area 101 as including the flexible substrate 110 and the array 111, the emission element 112, and the encapsulation layer 113 formed on the flexible substrate 110. A support layer 131 can be disposed under the substrate 110.

The flexible substrate 110 can be formed of, e.g., a polyimide resin-based material, but is not limited thereto. The inactive area 102 surrounding the active area 101 includes the bending area 103. On an upper part of the substrate 110 corresponding to the bending area 103, a micro coating layer (MCL) 133 can be disposed to suppress cutting and damage to various lines positioned on the bending area 103.

The MCL 133 is coated on the various lines, such as the data line 127, the VDD line 121, and the VSS line 122, formed on the bending area 103. Thus, during bending, the lines can be manipulated to be positioned adjacent to a neutral line. Accordingly, the lines can be applied with tensile stress generated on the neutral line and compressive stress generated under the neutral line as little as possible, which results in the improvement in durability. Further, the MCL 133 can also physically and chemically protect the various lines disposed on the substrate 110 against external impacts, moisture or dust during the manufacture.

FIG. 3 is a cross-sectional view illustrating an example of a laminated structure of the display panel 100. For convenience of illustration, FIG. 3 illustrates that the TFT array 111 and the emission element 112 on the flexible substrate 110 are flat and the encapsulation layer 113 is a single layer. Preferably, the encapsulation layer 113 can have a three-layered film structure (an inorganic film/an organic film/an inorganic film) but is not limited thereto and can have five-layered film structure.

The encapsulation layer 113 can be disposed in the entire active area 101 and extended to the inactive area 102 surrounding the active area 101 to protect the emission element 112 which is vulnerable to external moisture or dust.

Preferably, the encapsulation layer of the present disclosure can have a three-layered structure of an inorganic film/an organic film/an inorganic film, and an Si-based material such as SiNx, SiOx, or SiON can be used for the inorganic film.

The organic film used in the encapsulation layer can also be referred to as a particle capping layer (PCL) and can be formed of an epoxy resin which is a kind of polymer. Further, the inorganic film may not be a single layer but can be formed as a plurality of inorganic layers of SiNx/SiON. Each of the inorganic films can be formed to a thickness of from about 0.5 μm to about 1 μm, and the organic film can be formed to a thickness of from about 7 μm to about 20 μm. The thicknesses of the inorganic film and the organic film may not be limited thereto.

FIG. 3 illustrates an example of a capacitive touch method or force touch method capable of sensing a touch pressure or a pen touch method capable of sensing a touch by a pen. A first adhesive layer 141 and a first touch sensing layer 142 are disposed on the encapsulation layer 113, and a second touch sensing layer 132 can be disposed under the flexible substrate 110. A capacitive touch sensing layer can be disposed as the first touch sensing layer 142, and a force touch or pen touch sensing layer can be disposed as the second touch sensing layer 132. The embodiment of the present disclosure is not limited only to the touch methods and can also be applied to a touch-on encapsulation (TOE) method. In the TOE method, a capacitive touch sensing layer is formed on the encapsulation layer 113 without the second touch sensing layer 132.

A polarizing layer 143 can be disposed on the first touch sensing layer 142 of the present disclosure. The polarizing layer 143 can function to minimize the effect of incident light generated from an external light source on the emission element 112 within the display panel 100. The embodiment of the present disclosure is not limited to the structure illustrated in FIG. 3. As for a product with high touch sensitivity, the first touch sensing layer 142 and the polarizing layer 143 can be repositioned.

A second adhesive layer 144 and a deco film 145 can be disposed on the polarizing layer 143, and a cover window 146 can be bonded to the outside of the deco film 145 and can protect the display panel 100 against external environment.

The deco film 145 is positioned on an upper part of the display panel 100 and hides the inactive area 102 outside the active area 101 from a user's view. Therefore, the deco film 145 protects the components in the inactive area 102 against external light source and provides an aesthetic effect by which the user can see only the active area 101.

The support layer 131 can be disposed under the flexible substrate 110, and the second touch sensing layer 132 can be disposed under the support layer 131. The support layer 131 can have a thickness of, e.g., from 100 μm to 125 μm, from 50 μm to 150 μm, from 75 μm to 200 μm, less than 150 μm, or more than 100 μm, but is not limited thereto. The support layer 131 can be formed of, e.g., polyethylene terephthalate (PET). The support layer 131 can be cut using a laser or the like, and the bending area 103 can be formed by bending the support layer 131 such that trimming lines of the support layer 131 face each other.

The second sensing layer 132 can be disposed on a lower part of the substrate 110. The second sensing layer 132 can be configured as a force touch type for sensing a touch pressure or a capacitive touch type for sensing a touch by a pen.

A metal layer can be added under the support layer 131 or under the second touch sensing layer 132. The addition of the metal layer can cause the generation of noise from a battery of a module or semiconductor chips to which the display panel 100 is bonded. Further, the noise can cause electromagnetic interference (EMI) to the display panel 100. The EMI can lead to malfunction of a TFT or OLED of the array 111 or visual anomalies on the display screen. To avoid this situation, the metal layer having a thickness of about 0.1 mm can be provided and can suppress the occurrence of EMI. Otherwise, the addition of the metal layer can provide a heat dissipation effect of dissipating heat generated from a light source of the display panel 100 and a rigidity improving effect for more securely supporting the flexible substrate 110.

The FPCB 136 and the pad 135 can be provided on one end portion of the flexible substrate 110. During bending, the pad 135 and the FPCB 136 bonded to the pad 135 are positioned behind the screen of the active area 101. Thus, the plane size of the display panel 100 can be reduced relatively.

Between the bent flexible substrates 110, an adhesive 134 can be provided under the support layer 131 to maintain the bent form. For example, the adhesive 134 can be a foam tape. For example, the adhesive 134 can include a pressure sensing adhesive, a foam-type adhesive, a liquid adhesive, a photocurable adhesive, or any other proper adhesive material. The adhesive 134 can be formed of a compressive material or can contain a compressive material. The adhesive 134 can serve as a cushion for the parts bonded to the adhesive 134. For example, a material of the adhesive 134 can have compressive properties. The adhesive 134 can be formed as a plurality of layers including a cushion layer (e.g., polyolefin foam) between upper and lower layers of an adhesive material.

The adhesive 134 can be disposed on at least one of an upper surface and a lower surface of an extended body of the support layer 131.

The driver IC 137, the pad 135, and the FPCB 136 electrically connected to the pad 135 formed on the top surface of the flexible substrate 110 can be positioned opposite to the active area 101 by bending.

The MCL 133 can be disposed as shown in FIG. 3 to protect the lines on the bent flexible substrate 110. The MCL 133 can be coated on the entire bending area 103 starting from the vicinity of the driver IC 137 to contact a side wall of the first adhesive layer 141 including the encapsulation layer 113 for sufficient protection of the lines. In this situation, a part of the MCL 133 may be excessively coated in the vicinity of the first adhesive layer 141 (e.g., the MCL 133 can be thickly coated on or near the edge of the first adhesive layer 141) or can be in contact with or adjacent to the first touch sensing layer 142 by surface tension between the first adhesive layer 141 and the MCL 133 when coating is ended. The MCL 133 can be coated entirely from the vicinity of the driver IC 137 to the first adhesive layer 141 via the bending area 103. The MCL 133 can be disposed along the notch 151 formed in the inactive area 102 and the bending area 103 as described above with reference to FIG. 1.

FIG. 4 is an enlarged view of an area where the notch 151 of FIG. 1 is formed and illustrates the components in the bending area 103 and the inactive area 102 before bending.

The display panel 100 includes the active area 101 and the inactive area 102 surrounding the active area 101. In the display panel 100, the notch 151 can be formed by inwardly cutting a corner of the flexible substrate 110 between the active area 101 and the inactive area 102 on which the driver IC 137 and the pad 135 are formed and which is folded to the back side of the substrate during bending. Thus, substrate cutting lines can be formed as shown in FIG. 4. To achieve a slim bezel or narrow bezel, as the area of the bent substrate during bending decreases during bending, stress applied to the substrate during bending decreases. Therefore, the convenience in processing can be improved. Further, the crack stopper structure 126 can be provided within a predetermined distance from the substrate along the trimming lines to suppress the spread of the cracks which can occur during a scribing process. The trimming lines of the substrate can have round corners as shown in FIG. 4, and, thus, the convenience in processing and durability can be improved.

The GIP 123 and the ESD 124 can be disposed on a lateral side of the active area 101 and along the periphery of the VSS 122 for grounding. External power supplied from the pad 135 can be supplied to the inactive area 102 adjacent to the active area 101 via the bending area 103 through the VDD 121 and the gate power supply 127. The data line 127 can be extended from the driver IC 137 to the active area 101 via the bending area 103. These various lines pass through the bending area 103, and, thus, most of the lines are exposed to tensile and compressive stresses during bending. If a predetermined radius curvature of the flexible substrate 110 equal to a design value for the lines is decreased in a specific portion of the flexible substrate 110 to a smaller radius curvature than the design value by an external force, stress is concentrated on the portion. Thus, the lines may be damaged. Accordingly, a malfunction of the display panel 100 may occur.

Therefore, it may be desirable to suppress the deformation of the flexible substrate 110 having a predetermined radius curvature caused by an additional external force to protect the lines disposed in the bending area 103.

FIG. 5A and FIG. 5B show plan views of a cut structure of a support layer according to an embodiment of the present disclosure. FIG. 5A and FIG. 5B show examples where a predetermined radius curvature of the bending area 103 is maintained to protect the lines disposed in the bending area 103.

Referring to FIG. 5A, the support layer 131 can be disposed on the back side of the flexible substrate 110 on which an array and an OLED are formed. A plurality of cylindrical holes can be formed in a portion corresponding to the bending area 103. For example, a scribing process can be performed to the support layer 131 in the bending area 103 using a carbon dioxide ($CO_2$) laser. In this situation, a portion of the support layer 131 can be burnt and removed by irradiating a circular laser at a regular distance from one end to the other end of the top side of the bending area 103. The portion cut by the laser has a cylindrical shape rather than a full-dome shape. This is because the intensity of the laser beam decreases as the depth of the support layer 131 increases. Therefore, the intensity of the laser beam is lower in a portion of the support layer 131 more adjacent to the flexible substrate 110 than in the initial laser-irradiated surface of the support layer 131. As shown in FIG. 5A, the part cut by the laser can be formed to have a cylinder-shaped trimming line. If a portion of the support layer 131 in the bending area 103 is burnt off by consecutively repeating this process three times, remaining parts or segments of the support layer 131 can have three trimming lines as shown in FIG. 5A. FIG. 5A shows the cut portion with three lines obtained by repeating the process three times as an example, but the number of repetitions is not limited to three. A plurality of cut portions can be formed by repeating the scribing process two times, four times, or five times to be suitable for the radius curvature for the bending area and the thickness of the support layer. The remaining parts of the support layer 131 are shown as including cylindrical holes in the plan view and can be seen as including triangular pyramids or trapezoids from the side view. Referring to the side view, a temporary protecting film TPF is disposed on the flexible substrate 110. The temporary protecting film TPF is temporarily attached onto the encapsulation layer 113 and can be removed later before the polarizing layer 143 is bonded to the encapsulation layer 113. When bending is performed after the cut portion is formed, the bending area 103 can be bent as easily as when the support layer is not present in the bending area 103. Also, when the bending area 103 is bent, the remaining parts or segments of the support layer are in contact with each other and support the bending area 103. Thus, even when the external force is applied to a specific portion of the bending area 103, the predetermined radius curvature can be maintained.

Referring to FIG. 5B, the support layer 131 can be disposed on the back side of the flexible substrate 110 on which an array and an OLED are formed, and a plurality of diamond-shaped holes can be formed in a portion corresponding to the bending area 103, similarly to FIG. 5A, for example, using a carbon dioxide ($CO_2$) laser. In this situation, a portion of the support layer 131 in the bending area 103 can be burnt and cut by irradiating a diamond-shaped $CO_2$ laser beam at a regular distance from one end to the other end of the top side of the bending area 103. By repeating this process two more times, a cut portion of the support layer as shown in the plan view of FIG. 5B can be obtained. In the same manner as in the situation where the circular laser beam is used, the intensity of the laser beam can be different between on the incident surface of the support layer 131 and on the surface of the flexible substrate 110. Also, the intensity of the laser beam is highest on the incident surface of the support layer 131 and thus can decrease as getting closer to the substrate 110. Similarly to FIG. 5A, FIG. 5B illustrates the support layer including the cut portion with three lines obtained by consecutively repeating the scribing process three times. The number of repetitions can be changed to two or five depending on the radius curvature for the bending area and the thickness of the support layer. It can be seen from the side view of the cut portion of the support layer 131 in FIG. 5B similarly to FIG. 5A that the triangular pyramid- or trapezoid-shaped support layer remains. Since the support layer is partially cut, the bending area 103 can be easily bent due to the partial absence of the support layer. Further, during bending, the remaining parts of the support layer are in contact with each other and support the bending area 103. Thus, the bending area 103 can maintain the predetermined radius curvature.

FIG. 6A and FIG. 6B show various cut shapes of the support layer 131 in the bending area.

FIG. 6A shows examples of patterns formed by sequentially cutting out the support layer in a specific shape with the same distance from a pattern center point, as shown in FIG. 5A or FIG. 5B.

Examples of the patterns can include a zigzag pattern, a square pattern, or rectangular trench pattern as well as an oval pattern and a diamond pattern shown in FIG. 5A and FIG. 5B. The zigzag pattern or the trench pattern can be formed only by continuously cutting the support layer at one time with the laser. These continuous patterns can reduce a resistance of the support layer during bending, compared to the point patterns such as the oval or diamond pattern. However, it may take more time to form the continuous patterns with the laser. Therefore, various tests can be conducted to optimize the bending processability and the supportability of the support layer in consideration of the requirements for bending.

Referring to FIG. 6B, laser cutting starting points can be overlapped alternately so that a pattern center point in a first row can be positioned closer to a pattern center point in a second row than in FIG. 6A. Examples of patterns can include an overlapping oval pattern, an overlapping diamond pattern, and an overlapping square pattern. These patterns can have a higher bending processability than the non-overlapping point patterns shown in FIG. 6A due to the reduced distance between the pattern center points. Also, it may take a similar time to form the point patterns and the overlapping patterns in a laser pattern process. For example, a small amount of the support layer remains in the bending area, and, thus, the bending area can be easily bent. Further, the overlapping point patterns can use a laser pattern processing time shorter than the zigzag or trench pattern shown in FIG. 6A and similar to the oval or diamond pattern shown in FIG. 6A. Further, various cut patterns of the support layer make it possible to more precisely control the radius curvature.

FIG. 7A is an enlarged cross-sectional view of a portion III in FIG. 5A according to an embodiment of the present disclosure. FIG. 7B is an enlarged cross-sectional view of a portion IV in FIG. 2 according to an embodiment of the present disclosure. For example, FIG. 7A and FIG. 7B are enlarged side views of patterns obtained by cutting the support layer 131 with the laser.

FIG. 7A is an enlarged view of the portion III in FIG. 5A. The support layer 131 is disposed entirely on one side of the flexible substrate 110 and then cut using the laser. FIG. 7A is an actual picture of a cross-section of the support layer 131. It can be seen that the trapezoidal support layer 131 with a tapered trimming line is formed in the bending area. Specifically, the top of the tapered trimming line which is an incident surface for light can have a width in the range of from about 280 μm to about 300 μm. The bottom of the tapered trimming line which is the top surface of the substrate 110 and the base surface of the support layer 131 can have a width in the range of from about 10 μm to about 30 μm. While the support layer 131 is cut with the laser from the top incident surface to the bottom base surface, energy of the laser can be changed. Thus, the tapered shape as shown in FIG. 7A can be obtained. A taper angle θ can be, for example, from about 60° to about 70°, but is not limited thereto. In the present disclosure, the support layer 131 is cut using, for example, a $CO_2$ laser. The $CO_2$ laser is a gas laser that uses transition between levels of $CO_2$ molecular vibrations and produces a number of oscillation lines in the infrared region and particularly produces the maximum power at a wavelength of 10.6 μm in the infrared region. The $CO_2$ laser uses a gas mixture of $CO_2$, $N_2$ and He to improve the efficiency and thus produces high power with high efficiency. Its oscillation wavelength has advantages of low air propagation loss and high stability. In the present disclosure, the $CO_2$ laser which is widely used in precise cutting has been described as an example. However, the present disclosure is not limited thereto.

FIG. 7B is an enlarged view of the portion IV in FIG. 2 and shows a cross-sectional view of the flexible substrate 110 in which the support layer 131 shown in FIG. 7A is cut and bending is performed along the bending area. It can be seen that when the support layer 131 is cut with the laser, cut slanted surfaces are in contact with each other and the remaining parts or segments of the support layer 131 support the flexible substrate 110 from its back side. For example, the support layer 131 can have a thickness of about 0.15 mm, the foam tape can have a thickness of about 0.2 mm, and a separate metal layer or the second touch sensing layer 132 can be formed to a thickness of about 0.1 mm under the support layer 131. In this situation, a distance between the substrates can be about 0.6 mm. The display panel 100 can have a small radius curvature of about 0.3 R at which deformation caused by external force can be minimized since the bending part is supported by the support layer 131. In a state where the cut slanted surfaces of the support layer 131 are in contact with each other, an angle θ between the top surfaces of the support layer 131 can be about 120° and can be in the range of from about 100° to about 140°.

FIG. 8 shows the sequence of processes according to an embodiment of the present disclosure.

The basic TFT array 111, the organic emission element 112, and the encapsulation layer 113 are formed on the flexible substrate 110 formed on a glass substrate (S810).

The TPF was attached onto the encapsulation layer 113 to suppress damage to the encapsulation layer 113 and protect the organic emission element 112 and the like against external environment in a process to be performed later, and the glass substrate and the flexible substrate 110 are released from each other (S820).

Then, the support layer 131 can be bonded to the back side of the flexible substrate 110 (S830).

In a state where the flexible substrate 110 is reinforced by the support layer 131, the entire mother board on which a plurality of cells is gathered is cut first with a laser to separate the display panel 100 as a cell unit.

Then, a bending area corresponding to the support layer 131 disposed on the back side of the flexible substrate 110 is cut secondarily with a laser to remove a portion of the support layer 131 disposed on the back side of the flexible substrate 110 (S840). Also, the flexible substrate 110 can be folded at a constant radius curvature in a subsequent bezel bending process (S850).

Before and after the secondary laser cutting process, a second touch sensing layer for sensing a pen touch or a force touch can be added under the support layer 131 depending on the touch method.

Then, the TPF temporarily attached onto the encapsulation layer 113 can be removed. Then, the first adhesive layer 141, the first touch sensing layer 142, and the polarizing layer 143 can be bonded to cover a part of the active area 101 and a part of the inactive area 102 (S860).

The driver IC 137 can be bonded to a bent and folded area of the flexible substrate 110 and the FPCB 136 connected to various circuits and an external power supply can be bonded to the pad 135 (S870).

The second adhesive layer 144, the deco film 145, and the cover window 146 can be bonded onto the polarizing layer 143 to complete the final process for the display panel 100 (S880)

Therefore, the present disclosure can provide a display apparatus in which a part of a support layer extended from an active area to an inactive area where a circuit board is disposed has a cut portion in a bending area.

Examples of the display apparatus according to embodiments of the present disclosure can include a liquid crystal display apparatus (LCD), a field emission display apparatus (FED), an organic light emitting display apparatus (OLED), a quantum dot display apparatus, and the like.

Examples of the display apparatus according to embodiments of the present disclosure can include a set apparatus (or a set device) or a set electronic device such as a notebook computer, a TV, a computer monitor, an automotive display or another type of equipment display for vehicles, or a mobile electronic device such as a smartphone or an electronic pad, which are complete products (or final products) including an LCM, an OLED module, or the like.

The present disclosure can provide a display apparatus in which a support layer having a cut portion in a bending area has a tapered cross-section.

The present disclosure can provide a display apparatus in which trimming lines of a support layer having a plurality of cut portions in a bending area face each other.

The present disclosure can provide a display apparatus in which a support layer having a plurality of cut portions in a bending area is formed by laser cutting.

The present disclosure can provide a display apparatus in which a support layer in a bending area has three cut portions.

The present disclosure can provide a display apparatus in which a support layer in a bending area includes at least two segments.

The present disclosure can provide a display apparatus in which trimming lines of a support layer including at least two segments in a bending area face each other.

The present disclosure can provide a display apparatus in which an angle between top surfaces of a support layer in a bending area is more than 100° and less than 140°.

The present disclosure can provide a display apparatus in which a set of at least one cylindrical hole is formed in a part of a bending part from which a support layer is removed.

The present disclosure can provide a display apparatus in which a set of at least one pyramid hole is formed in a part of a bending part from which a support layer is removed.

The present disclosure can provide a display apparatus in which at least one rectangular trench is formed in a part of a bending part from which a support layer is removed.

The present disclosure can provide a display apparatus in which a trimming line from which a support layer in a bending part is removed has a taper angle of from about 60° to about 70°.

The present disclosure can provide a display apparatus in which a crack stopper structure with a GIP and an ESD are provided in an inactive area and notches are formed by cutting at least two corners of the inactive area.

The present disclosure can provide a display apparatus in which an organic coating layer is formed in a bending area along a notch line to protect lines disposed in the bending area.

The present disclosure can provide a display apparatus in which a first touch sensing layer is provided on a substrate and a second touch sensing layer is provided under the substrate.

Although the embodiments of the present disclosure have been described in detail with reference to the accompanying drawings, it is to be understood that the present disclosure is not limited to those embodiments and various changes and modifications may be made without departing from the scope of the present disclosure. Therefore, the embodiments disclosed in the present disclosure are intended to illustrate rather than limit the scope of the present disclosure, and the scope of the technical idea of the present disclosure is not limited by these embodiments. Therefore, it should be understood that the above-described embodiments are illustrative in all aspects and not restrictive. The scope of the present disclosure should be construed according to the claims, and all technical ideas within the scope of equivalents should be construed as falling within the scope of the present disclosure.

What is claimed is:

1. A flexible display apparatus, comprising:
   a flexible substrate including:
      an active area including a plurality of driving thin film transistors (TFTs) and a plurality of organic emission elements, and
      an inactive area including a first inactive area adjacent to the active area, a second inactive area for a circuit board, and a bending area between the first inactive area and the second inactive area;
   a component disposed on at least a part of the first inactive area;
   a plurality of wiring lines extending from the plurality of driving TFTs to the first inactive area, the bending area and the second inactive area; and
   a support layer disposed across the active area, the first inactive area, the bending area, and the second inactive area,
   wherein the support layer includes a plurality of cut portions overlapping with the bending area of the flexible substrate and a plurality of segmented portions between the plurality of cut portions, and
   wherein when the bending area is bent, the plurality of segmented portions are in contact with each other in the bending area.

2. The flexible display apparatus according to claim 1, further comprising:
   a polarizing layer and a cover window disposed on the flexible substrate.

3. The flexible display apparatus according to claim 2, further comprising:
   a touch sensing layer disposed on at least one of a top surface of the flexible substrate or a bottom surface of the flexible substrate.

4. The flexible display apparatus according to claim 1, wherein each of the plurality of cut portions of the support layer has a tapered shape relative to the flexible substrate.

5. The flexible display apparatus according to claim 1, wherein the component includes a crack stopper structure, a gate-in-panel circuit (GIP), and an electrostatic discharge (ESD) circuit.

6. The flexible display apparatus according to claim 1, further comprising:
   a notch in the flexible substrate, the notch extending from the first inactive area to the second inactive area via the bending area; and
   an organic coating layer disposed along an edge of the notch from the first inactive area to the second inactive area.

7. The flexible display apparatus according to claim 1, wherein an angle between top surfaces of the support layer including the plurality of segmented portions is greater than 100° and less than 140°.

8. A flexible display apparatus, comprising:
   a substrate including an active area and an inactive area;
   a light emitting display element disposed in the active area; and
   an encapsulation layer disposed on at least a part of the inactive area and covering the light emitting display element in the active area;
   a polarizing layer disposed on the encapsulation layer;
   a cover window disposed on the polarizing layer;
   a first component forming part formed along a part of the inactive area, a notch line and a bending part;
   a second component forming part formed along an outermost periphery of the inactive area and including a bottom surface facing a bottom surface of the active area; and
   a support layer extending along the bottom surface of the active area and the bottom surface of the second component forming part,
   wherein a part of the support layer overlapping with the bending part has removed portions and segmented portions between the removed portions, and
   wherein when the bending part is bent, the segmented portions are in contact with each other in the bending part.

9. The flexible display apparatus according to claim 8, wherein a bottom surface of the bending part includes at least two areas from which the support layer is removed.

10. The flexible display apparatus according to claim 8, wherein the notch line is defined by cutting at least two corners of the inactive area.

11. The flexible display apparatus according to claim 9, wherein in the bottom surface of the bending part, one or more cylindrical holes are located in the at least two areas from which the support layer is removed.

12. The flexible display apparatus according to claim 9, wherein in the bottom surface of the bending part, one or more pyramid shaped holes are located in the at least two areas from which the support layer is removed.

13. The flexible display apparatus according to claim 9, wherein in the bottom surface of the bending part, at least one rectangular trench is located in the at least two areas from which the support layer is removed.

14. The flexible display apparatus according to claim 8, wherein a cross-section of the part with the removed portions has a forward tapered shape.

15. The flexible display apparatus according to claim 14, wherein the cross-section of the part with the removed portions has a taper angle of about 60° to about 70°.

16. The flexible display apparatus according to claim 8, wherein the first component forming part includes a crack stopper structure and a gate-in-panel circuit (GIP).

17. The flexible display apparatus according to claim 8, further comprising:
   a touch sensing layer disposed under the support layer.

\* \* \* \* \*